United States Patent
Ping et al.

(10) Patent No.: US 12,376,291 B2
(45) Date of Patent: Jul. 29, 2025

(54) SEMICONDUCTOR DEVICE INCLUDING SHARED SENSE AMPLIFICATION CIRCUIT GROUP

(71) Applicant: CHANGXIN MEMORY TECHNOLOGIES, INC., Hefei (CN)

(72) Inventors: Erxuan Ping, Hefei (CN); Zhen Zhou, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 737 days.

(21) Appl. No.: 17/520,789

(22) Filed: Nov. 8, 2021

(65) Prior Publication Data

US 2022/0077161 A1 Mar. 10, 2022

Related U.S. Application Data

(63) Continuation of application No. PCT/CN2021/100516, filed on Jun. 17, 2021.

(30) Foreign Application Priority Data

Sep. 4, 2020 (CN) .......................... 202010919699.7

(51) Int. Cl.
*G11C 11/40* (2006.01)
*G11C 11/4091* (2006.01)
*H10B 12/00* (2023.01)

(52) U.S. Cl.
CPC .......... *H10B 12/50* (2023.02); *G11C 11/4091* (2013.01)

(58) Field of Classification Search
CPC ........................... H10B 12/20; G11C 11/4091
See application file for complete search history.

(56) References Cited

U.S. PATENT DOCUMENTS

| | | | | |
|---|---|---|---|---|
| 4,586,171 A | * | 4/1986 | Fujishima | G11C 11/4097 365/207 |
| 5,396,451 A | * | 3/1995 | Ema | H10B 12/318 365/72 |
| 5,535,153 A | * | 7/1996 | Saeki | G11C 5/06 365/72 |
| 5,748,547 A | * | 5/1998 | Shau | G11C 11/4096 257/E27.092 |
| 5,946,254 A | * | 8/1999 | Tsuchida | G11C 7/18 365/208 |

(Continued)

FOREIGN PATENT DOCUMENTS

| CN | 1156314 A | 8/1997 |
|---|---|---|
| CN | 1182917 A | 5/1998 |

(Continued)

OTHER PUBLICATIONS

First Office Action of the Chinese application No. 202010919699.7, issued on Jun. 5, 2023. 12 pages with English abstract.

(Continued)

*Primary Examiner* — Ida M Soward
(74) *Attorney, Agent, or Firm* — SYNCODA LLC; Feng Ma

(57) ABSTRACT

A semiconductor device is provided. The semiconductor device includes a plurality of memory cell groups and a plurality of sense amplification unit groups, and at least two memory cell groups share a same sense amplification unit group.

10 Claims, 3 Drawing Sheets

(56) References Cited

U.S. PATENT DOCUMENTS

| | | | |
|---|---|---|---|
| 6,165,692 A * | 12/2000 | Kanai | G03F 1/30 |
| | | | 430/311 |
| 6,201,728 B1 * | 3/2001 | Narui | H10B 12/30 |
| | | | 365/230.06 |
| RE37,641 E | 4/2002 | Foss | |
| 6,501,672 B1 * | 12/2002 | Sekiguchi | H10B 12/50 |
| | | | 365/207 |
| 7,872,902 B2 | 1/2011 | Volrath | |
| 9,679,620 B1 | 6/2017 | Yun et al. | |
| 10,387,047 B2 * | 8/2019 | Shiah | G06F 3/065 |
| 2002/0093843 A1 * | 7/2002 | Nakai | H10B 12/48 |
| | | | 257/E27.096 |
| 2003/0095429 A1 * | 5/2003 | Hirose | G11C 7/18 |
| | | | 257/E21.656 |
| 2005/0063238 A1 | 3/2005 | Nambu | |
| 2005/0146972 A1 * | 7/2005 | Hong | G11C 11/4076 |
| | | | 365/227 |
| 2005/0157527 A1 | 7/2005 | Hirose | |
| 2006/0109731 A1 * | 5/2006 | Suh | G11C 11/4097 |
| | | | 365/230.03 |
| 2006/0215472 A1 * | 9/2006 | Yoon | G11C 11/4097 |
| | | | 365/207 |
| 2007/0070755 A1 | 3/2007 | Kim | |
| 2007/0081375 A1 * | 4/2007 | Kawakita | G11C 11/4099 |
| | | | 365/63 |
| 2008/0080282 A1 | 4/2008 | Chang | |
| 2009/0135639 A1 * | 5/2009 | Hirose | G11C 7/08 |
| | | | 365/72 |
| 2009/0219768 A1 | 9/2009 | Kim | |
| 2011/0182099 A1 * | 7/2011 | Kim | G11C 5/063 |
| | | | 365/51 |
| 2013/0026566 A1 * | 1/2013 | Kutsukake | H01L 21/761 |
| | | | 257/E27.103 |
| 2013/0135915 A1 * | 5/2013 | Kim | G11C 7/18 |
| | | | 365/51 |
| 2013/0250694 A1 * | 9/2013 | Kutsukake | H10B 41/49 |
| | | | 365/185.18 |
| 2014/0133251 A1 | 5/2014 | Takahashi | |
| 2017/0091021 A1 * | 3/2017 | Abedifard | G11C 11/1693 |
| 2017/0147211 A1 | 5/2017 | Shiah et al. | |
| 2017/0148500 A1 | 5/2017 | Shiah et al. | |
| 2019/0189191 A1 | 6/2019 | Won et al. | |

FOREIGN PATENT DOCUMENTS

| | | | |
|---|---|---|---|
| CN | 1215893 A | 5/1999 | |
| CN | 1271944 A | 11/2000 | |
| CN | 1933020 A | 3/2007 | |
| CN | 1941162 A | 4/2007 | |
| CN | 1941193 A | 4/2007 | |
| CN | 101042927 A | 9/2007 | |
| CN | 106057228 A | 10/2016 | |
| CN | 107086046 A | 8/2017 | |
| CN | 109166598 A | 1/2019 | |
| CN | 109754830 A | 5/2019 | |
| CN | 109935259 A | 6/2019 | |
| CN | 110827887 A | 2/2020 | |
| JP | H01286196 A | 11/1989 | |
| KR | 100780954 B1 | 12/2007 | |
| TW | 518606 B | 1/2003 | |

OTHER PUBLICATIONS

International Search Report in the international application No. PCT/CN2021/100516, mailed on Sep. 15, 2021. 2 pages.

English translation of the Written Opinion of the International Search Authority in the international application No. PCT/CN2021/100516, mailed on Sep. 15, 2021. 3 pages.

* cited by examiner

SEMICONDUCTOR DEVICE INCLUDING SHARED SENSE AMPLIFICATION CIRCUIT GROUP

CROSS-REFERENCE TO RELATED APPLICATIONS

This is a continuation application of International Patent Application No. PCT/CN2021/100516, filed on Jun. 17, 2021, which claims priority to Chinese Patent Application No. 202010919699.7, filed on Sep. 4, 2020 and entitled "SEMICONDUCTOR DEVICE". The disclosures of International Patent Application No. PCT/CN2021/100516 and Chinese Patent Application No. 202010919699.7 are incorporated by reference herein in their entireties.

TECHNICAL FIELD

The disclosure relates to the field of integrated circuits, in particular to a semiconductor device.

BACKGROUND

As a type of semiconductor memory device, a Dynamic Random Access Memory (DRAM) is operated through charge recording data stored in a cell capacitor of a memory cell. Each memory cell is connected to a bit line.

A sense amplifier of the semiconductor memory device is an amplification circuit which senses a micro signal. The micro signal is a signal with a very low voltage or current. A typical sense amplifier is a bit line sense amplifier, which is configured to sense and amplify the micro signal generated by the memory cell on the bit line, and transmit the read data to a data reading and writing circuit.

However, in the existing semiconductor device, sense amplification units are distributed on both sides of each memory cell. Since the area of the sense amplification unit cannot be further reduced, in a case that the total area of the semiconductor device is constant, the occupied area of the memory cells cannot be further enlarged, so that the storage capacity of the semiconductor device cannot be further increased. Alternatively, in a case that the storage capacity of the semiconductor device remains unchanged, the area of the semiconductor device cannot be further reduced.

SUMMARY

The technical problem to be solved by the disclosure is to provide a semiconductor device, which can reduce the area occupied by the sense amplification units, thereby saving more area for increasing the storage capacity or reducing the area of the semiconductor device.

In order to solve the above-mentioned problem, the disclosure provides a semiconductor device. The semiconductor device includes a plurality of memory cell groups and a plurality of sense application unit groups. At least two memory cell groups share a same sense amplification unit group.

BRIEF DESCRIPTION OF THE DRAWINGS

In order to describe the technical solutions in embodiments of the disclosure more clearly, the accompanying drawings required to be used in the embodiments of the disclosure will be simply introduced below. Apparently, the accompanying drawings in the following description show merely some embodiments of the disclosure, and persons of ordinary skill in the art may still derive other drawings from these accompanying drawings without creative effort.

DETAILED DESCRIPTION

Figure 1:
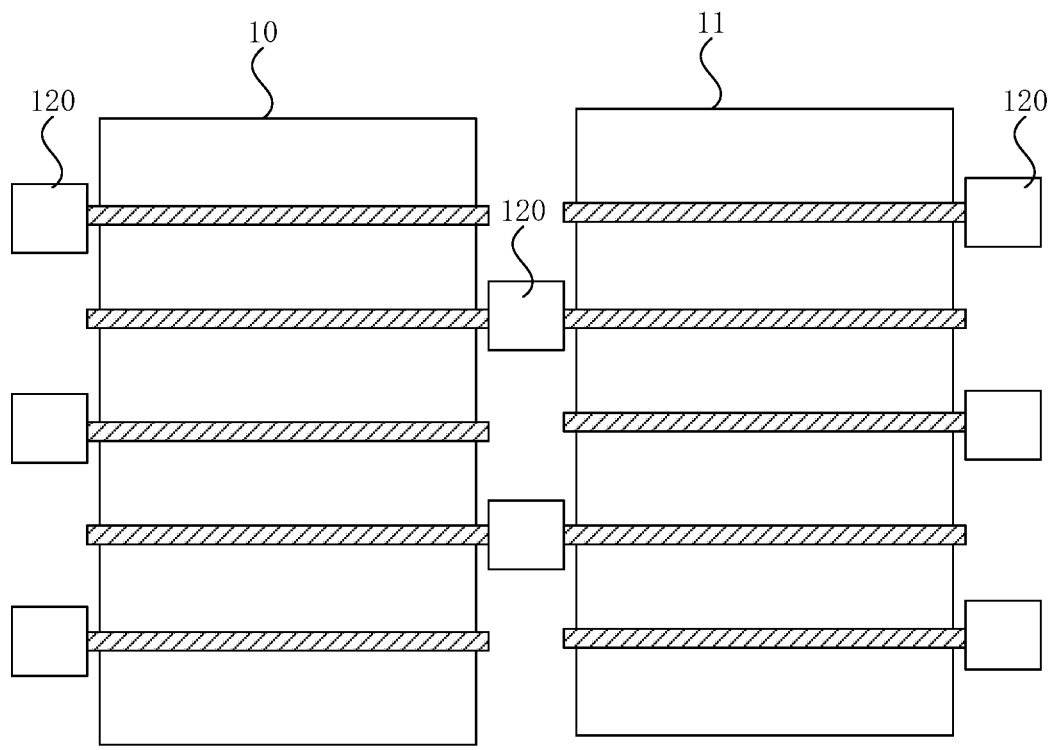
FIG. 1 is a schematic diagram of an existing semiconductor device.

FIG. 1 is a schematic diagram of a semiconductor device. Referring to FIG. 1, the semiconductor device includes a plurality of memory cell groups. A first memory cell group 10 and a second memory cell group 11 are schematically shown in FIG. 1. Sense amplification units are distributed at both sides of each of the memory cell groups. Specifically, a plurality of sense amplification units 120 are distributed at both sides of the first memory cell group 10, and a plurality of sense amplification units 120 are distributed on both sides of the second memory cell group 11. Since the area of the sense amplification units 120 cannot be further reduced, in a case that the total area of the semiconductor device is constant, the occupied area of the memory cell groups cannot further be enlarged, so that the storage capacity of the semiconductor device cannot be further increased. Alternatively, in a case that the storage capacity of the semiconductor device remains unchanged, the area of the semiconductor device cannot be further reduced.

In view of this, the disclosure provides a semiconductor device, which can enlarge the occupied area of the memory cell groups and increase the storage capacity of the semiconductor device in a case that the total area of the semiconductor device is constant; or further reduce the area of the semiconductor device in a case that the storage capacity of the semiconductor device remains unchanged.

In order to make the objectives, technical solutions and effects of the disclosure clearer, the disclosure will be further described below with reference to the accompanying drawings. It is to be understood that the embodiments described here are merely some rather than all of the embodiments of the disclosure, and are not intended to limit the disclosure. All other embodiments obtained by those skilled in the art base on the embodiments of the disclosure without creative efforts shall fall within the protection scope of the disclosure.

Figure 2:
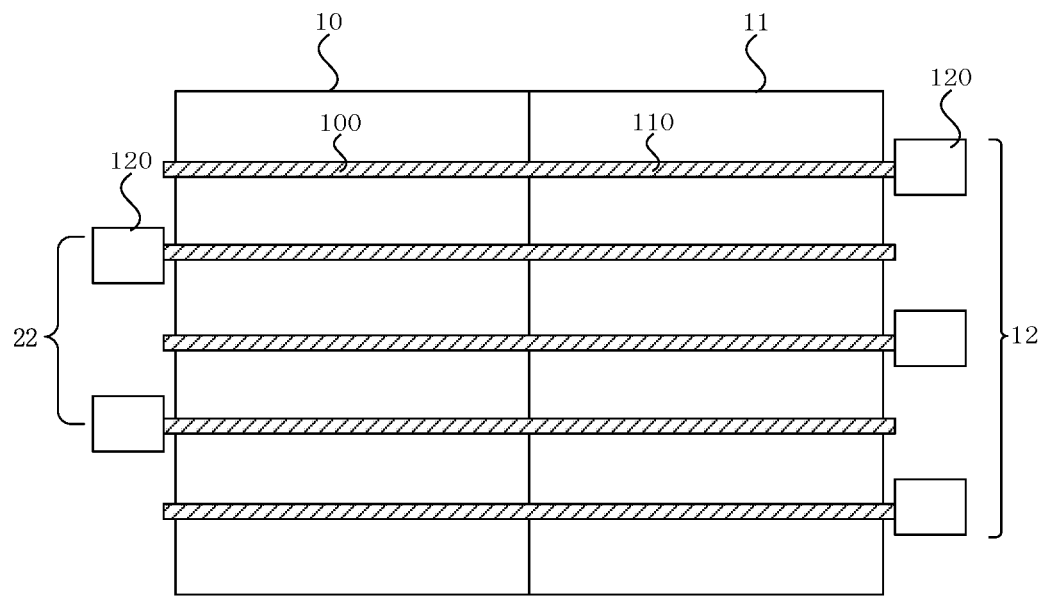
FIG. 2 is a schematic diagram of an embodiment of a semiconductor device of the disclosure.

FIG. 2 is a schematic diagram of an embodiment of a semiconductor device of the disclosure. Referring to FIG. 2, the semiconductor device includes a plurality of memory cell groups and a plurality of sense amplification unit groups. At least two memory cell groups share a same sense amplification unit group.

In this embodiment, in order to clearly illustrate the structure of the semiconductor device of the disclosure, only two memory cell groups are schematically shown in FIG. 2, namely a first memory cell group 10 and a second memory cell group 11. And the sense amplification unit groups are schematically shown. The sense amplification unit groups include a first sense amplification unit group 12 and a second sense amplification unit group 22.

Each memory cell group may be composed of a plurality of memory cells (not shown in the figure). The memory cells are configured to store data. Each memory cell generally includes a capacitor and a transistor. A gate of the transistor is connected to a word line, a drain of the transistor is connected to a bit line, and a source of the transistor is connected to a capacitor. Specifically, the plurality of memory cells form a complete storage array. The complete storage array is the memory cell group.

The first sense amplification unit group 12 and the second sense amplification unit group 22 are configured to sense and amplify a micro signal generated by the memory cell groups. The sense amplification unit group is an amplification circuit for sensing the micro signal, which is a conventional structure in the art. The sense amplification unit group may be understood as a unit group consisting of the sense amplification units 120 arranged in a single column along an arrangement direction of the bit lines of the memory cell group. As shown in FIG. 2, three sense amplification units 120 on the right side of the second memory cell group 11 are arranged in a column along an arrangement direction of the second bit lines 110 of the second memory cell group 11, so as to form the first sense amplification unit group 12. Two sense amplification units 120 on the left side of the first memory cell group 10 are arranged in a column along an arrangement direction of the first bit lines 100 of the first memory cell group 10, so as to form the second sense amplification unit group 22.

Herein, at least two memory cell groups share a same sense amplification unit group. Specifically, in this embodiment, two adjacent memory cells share two sense amplification unit groups. For example, the first memory cell group 10 and the second memory cell group 11 share the first sense amplification unit group 12 and the second sense amplification unit group 22. In other embodiments of the disclosure, it may also be the case that two or more memory cell groups share a same sense amplification unit group. For example, three memory cell groups share a same sense amplification unit group.

In the semiconductor device of the disclosure, at least two memory cell groups share a same sense amplification unit group. The sense amplification units arranged between two adjacent memory cell groups may be omitted. Thus, a region is vacated, so that the memory cells may be provided in this region, so as to increase the number of memory cells included in the memory cell groups. Therefore, in a case that the total area of the semiconductor device is constant, the storage capacity of the semiconductor device is enlarged. Alternatively, in a case that the storage capacity of the semiconductor device remains unchanged, the two adjacent memory cell groups are brought closer to further reduce the area of the semiconductor device.

In other words, in the semiconductor device of the disclosure, each of the sense amplification unit groups acts on at least two the memory cell groups. For example, in this embodiment, the first sense amplification unit group 12 can act on the first memory cell group 10 and the second memory cell group 11. In another embodiment of the disclosure, one sense amplification unit group may also act on two or more memory cell groups. For example, one sense amplification unit group act on three memory cell groups.

Further, each memory cell group includes a plurality of bit lines. Each sense amplification unit group includes a plurality of sense amplification units, and each sense amplification unit is electrically connected to a respective one of the bit lines. The sense amplification units are configured to sense and amplify the micro signal generated by the memory cells on the bit lines, and transmit the read data to a data reading and writing circuit.

Specifically, in this embodiment, the first memory cell group 10 includes a plurality of first bit lines 100. The first bit lines 100 are electrically connected to the memory cells in the first memory cell group 10. The second memory cell group 11 includes a plurality of second bit lines 110. The second bit lines 110 are electrically connected to the memory cells in the second memory cell group 11. Each of the first sense amplification unit group 12 and the second sense amplification unit group 22 includes a plurality of sense amplification units 120. Each of the sense amplification units 120 is electrically connected to a respective one of the first bit lines 100 and a respective one of the second bit lines 110. That is to say, the first bit line 100 and the second bit line 110 are both electrically connected to the same sense amplification unit 120. Specifically, the number of the first bit lines 100 in the first memory cell group 10 is the same as that of the second bit lines 110 in the second memory cell group 11, and the number of the second bit lines 110 is the same as the total number of the sense amplification units 120 in the first sense amplification unit group 12 and the second sense amplification unit group 22. Each sense amplification unit 120 corresponds to and is electrically connected to a respective one of the first bit lines 100 and a respective one of the second bit lines 200.

The sense amplification units 120 are configured to sense and amplify the micro signal generated by the memory cells on the first bit lines 100, and transmit the read data to the data reading and writing circuit. The sense amplification units 120 are configured to sense and amplify the micro signal generated by the memory cells on the second bit lines 110, and transmit the read data to the data reading and writing circuit.

Further, the sense amplification unit groups are arranged at a side of one of the two memory cell groups away from the other of the two memory cell groups, and at a side of the other of the two memory cell groups away from the one of the two memory cell groups. If the sense amplification units of the sense amplification unit groups are all arranged at one side of one of the memory cell groups, for example, if the sense amplification units are all arranged at one side of the first memory cell group 10, since the occupied area of the sense amplification units is relatively large, all of the sense amplification units cannot be arranged at one side of the first memory cell group 10. Therefore, in this embodiment, the sense amplification unit groups are arranged at a side of one of the two memory cell groups away from the other of the two memory cell groups, and at a side of the other of the two memory cell groups away from the one of the two memory cell groups. Specifically, the first memory cell group 10 and the second memory cell group 11 share the first sense amplification unit group 12 and the second sense amplification unit group 22, so that the second sense amplification unit group 22 is arranged at a side of the first memory cell group 10 away from the second memory cell group 11, and the first sense amplification unit group 12 is arranged at a side of the second memory cell group 11 away from the first memory cell group 10. There is no sense amplification unit 120 between the first memory cell group 10 and the second memory cell group 11, so that a region is vacated, and the memory cells may be provided in this region, so as to increase the number of memory cells included in the first memory cell group 10 and the second memory cell group 11. Thus, in a case that the total area of the semiconductor device is constant, the storage capacity of the semiconductor device is enlarged. Alternatively, in a case that the storage capacity of the semiconductor device remains unchanged, the first memory cell group 10 and the second memory cell group 11 are brought closer to further reduce the area of the semiconductor device.

Further, in order to provide enough regions to form the sense amplification units, the sense amplification units are alternately distributed relative to the bit lines. Specifically, in this embodiment, the sense amplification units 120 arranged at the left side of the first memory cell group 10 and the sense amplification units 120 arranged at the right side of the second memory cell group 11 are alternately distributed, so that enough area can be provided at the left side of the first memory cell group 10 and at the right side of the second memory cell group 11 to form the sense amplification units 120, thereby allowing the sense amplification units 120 to be evenly distributed at a side of one of the two memory cell groups away from the other of the two memory cell groups, and at a side of the other of the two memory cell groups away from the one of the two memory cell groups.

Further, the semiconductor device further includes a plurality of selection switch groups. Each selection switch group may include a plurality of selection switches. Each sense amplification unit group is electrically connected to the memory cell groups through a respective one of the selection switch groups, so that the bit lines of different memory cell groups may not be in electrical communication with the same sense amplification unit in the sense amplification unit group at the same time, thereby preventing a sensing error of the sense amplification unit.

Figure 3:
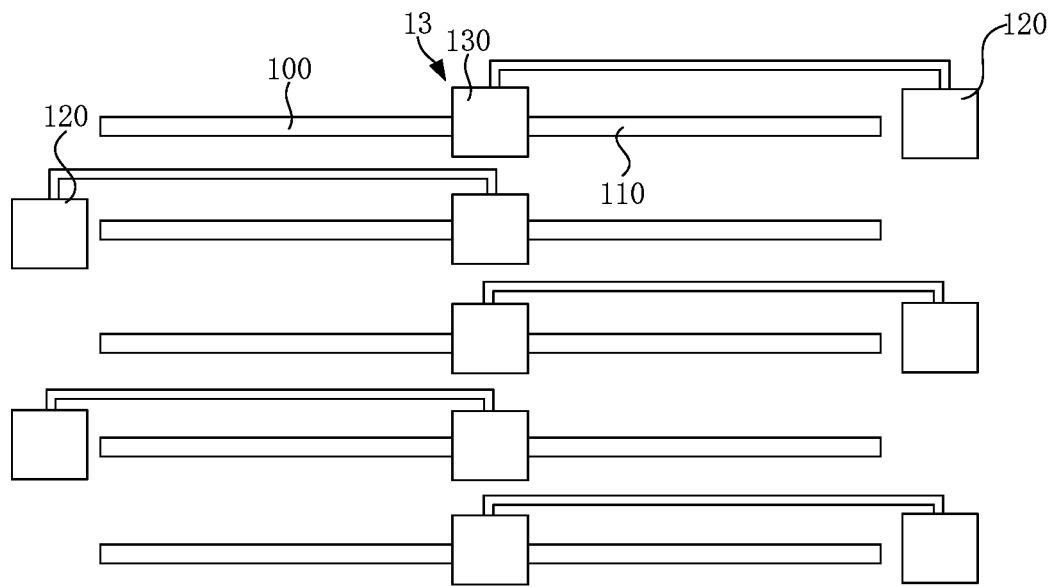
FIG. 3 is a schematic circuit diagram of an embodiment of a semiconductor device of the disclosure.

FIG. 3 is a schematic circuit diagram of an embodiment of a semiconductor device of the disclosure. Referring to FIG. 3, the selection switch group 13 includes a plurality of selection switches 130. Each sense amplification unit 120 is electrically connected to the bit lines through a respective one of the selection switches 130, so as to avoid that each sense amplification unit 120 is in electrical communication with the bit lines of different memory cell groups at the same time.

Specifically, the sense amplification unit 120 is electrically connected to a respective one of the first bit lines 100 and a respective one of the second bit lines 110 through a respective one of the selection switches 130. If the switching state of the selection switch 130 changes, the sense amplification unit 120 may be electrically connected to the first bit line 100, or may be electrically connected to the second bit line 110, so as to avoid that the sense amplification unit 120 is in electrical communication with the first bit line 100 and the second bit line 110 at the same time, thereby preventing a sensing error of the sense amplification unit 120.

For example, in one embodiment of the disclosure, if the selection switch 130 is in a closed state, the sense amplification unit 120 is electrically connected to the first bit line 100. If the selection switch 130 is in an open state, the sense amplification unit 120 is electrically connected to the second bit line 110.

Further, in one embodiment of the disclosure, the selection switch group 13 is arranged between the two memory cell groups which share the sense amplification unit group, so as to simplify the layout and placement. Specifically, the selection switch group 13 is arranged between the first memory cell group 10 and the second memory cell group 11.

Further, each sense amplification unit corresponds to a respective one of the bit lines and a respective one of the selection switches. Specifically, in this embodiment, one of the sense amplification units 120 is electrically connected to a respective one of the first bit lines 100 and a respective one of the second bit lines 110 through a respective one of the selection switches 130. That is, change of the switching state of the selection switch 130 only affects whether one of the sense amplification units 120 is in communication with its respective first bit line 100 and its respective second bit line 110, but does not affect whether other sense amplification units are in communication with their respective bit lines.

Figure 4:
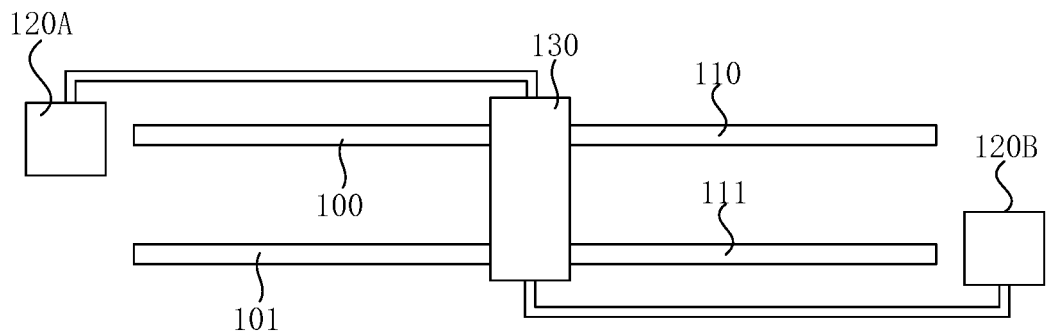
FIG. 4 is a schematic circuit diagram of another embodiment of a semiconductor device of the disclosure.

However, in other embodiments of the disclosure, a plurality of sense amplification units are electrically connected to the bit lines of the first memory cell group and the bit lines of the second memory cell group through a respective one of the selection switches. Specifically, as shown in FIG. 4, the sense amplification units 120A and 120B are electrically connected to the first bit lines 100 and 101 of the first memory cell group 10 and the second bit lines 110 and 111 of the second memory cell group 11 through a respective one of the selection switches 130. That is, change of the switching state of the selection switch 130 affects whether the two sense amplification units 120 are in communication with the first bit line 100 and the second bit line 110. For example, if the selection switch 130 is in a closed state, the sense amplification unit 120A is electrically connected to the first bit line 100, and the sense amplification unit 120B is electrically connected to the first bit line 101. If the selection switch 130 is in an open state, the sense amplification unit 120A is electrically connected to the second bit line 110, and the sense amplification unit 120B is electrically connected to the second bit line 111.

It may be understood that the above-mentioned embodiments only schematically show that the two sense amplification units are electrically connected to the bit lines of the first memory cell group and the bit lines of the second memory cell group through a respective one of the selection switches. In other embodiments of the disclosure, it may also be the case that three or more sense amplification units are electrically connected to the bit lines of the first memory cell group and the bit lines of the second memory cell group through a respective one of the selection switches.

Figure 5:
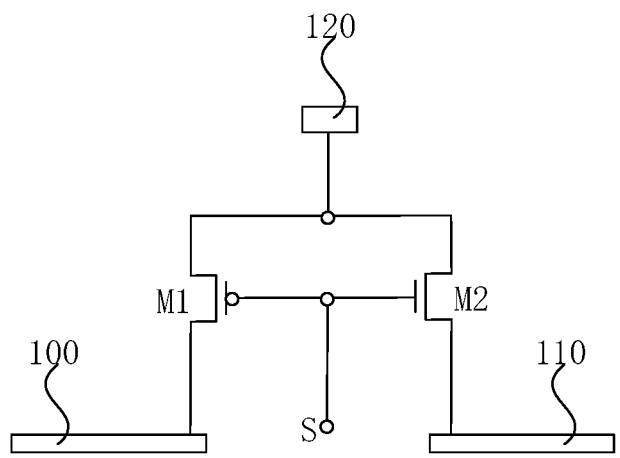
FIG. 5 is a schematic circuit diagram of another embodiment of a semiconductor device of the disclosure.

Further, the semiconductor device of the disclosure also provides an embodiment of a selection switch. FIG. 5 is a schematic circuit diagram of another embodiment of a semiconductor device of the disclosure. Referring to FIG. 5, in this embodiment, the sense amplification unit 120 can be electrically connected to the first bit line 100 of the first memory cell group 10 and the second bit line 110 of the second memory cell group 11 through the selection switch 130. The selection switch 130 includes an N-channel Metal Oxide Semiconductor (NMOS) transistor M1 and a P-channel Metal Oxide Semiconductor (PMOS) transistor M2. The NMOS transistor M1 and the PMOS transistor M2 are electrically connected to the bit lines in different memory cell groups respectively.

For example, in this embodiment, the NMOS transistor M1 is electrically connected to the first bit line 100 in the first memory cell group 10, and the PMOS transistor M2 is electrically connected to the second bit line 110 in the second memory cell group 11. When a control signal S is applied to the selection switch 130, if the control signal S is a high level signal, the NMOS transistor M1 is turned on, and the sense amplification unit 120 is electrically connected to the first bit line 100 of the first memory cell group 10, so that the sense amplification unit 120 senses and amplifies the micro signal generated by the first memory cell group 10 on the first bit line 100, and transmits the read data to the data reading and writing circuit. If the control signal S is a low level signal, the PMOS transistor M2 is turned on, and the sense amplification unit 120 is electrically connected to the second bit line 110 of the second memory cell group 11, so that the sense amplification unit 120 senses and amplifies the micro signal generated by the second memory cell group 11 on the second bit line 110, and transmits the read data to the data reading and writing circuit.

It may be understood that, in another embodiment of the disclosure, the NMOS transistor M1 is electrically connected to the second bit line 110 in the second memory cell group 11, and the PMOS transistor M2 is electrically connected to the first bit line 100 in the first memory cell group 10. When the control signal S is applied to the selection switch 130, if the control signal S is a high level signal, the PMOS transistor M2 is turned on, and the sense amplification unit 120 is electrically connected to the first bit line 100 of the first memory cell group 10, so that the sense amplification unit 120 senses and amplifies the micro signal generated by the first memory cell group 10 on the first bit line 100, and transmits the read data to the data reading and writing circuit. If the control signal S is a low level signal, the NMOS transistor M1 is turned on, and the sense amplification unit 120 is electrically connected to the second bit line 110 of the second memory cell group 11, so that the sense amplification unit 120 senses and amplifies the micro signal generated by the second memory cell group 11 on the second bit line 110, and transmits the read data to the data reading and writing circuit.

Further, a gate of the NMOS transistor M1 is electrically connected to a gate of the PMOS transistor M2, so as to facilitate the layout and placement, and to simplify the fabrication process. The control signal S controls whether the NMOS transistor M1 and the PMOS transistor M2 are turned on via the gates of the NMOS transistor M1 and the PMOS transistor M2.

Figure 6:
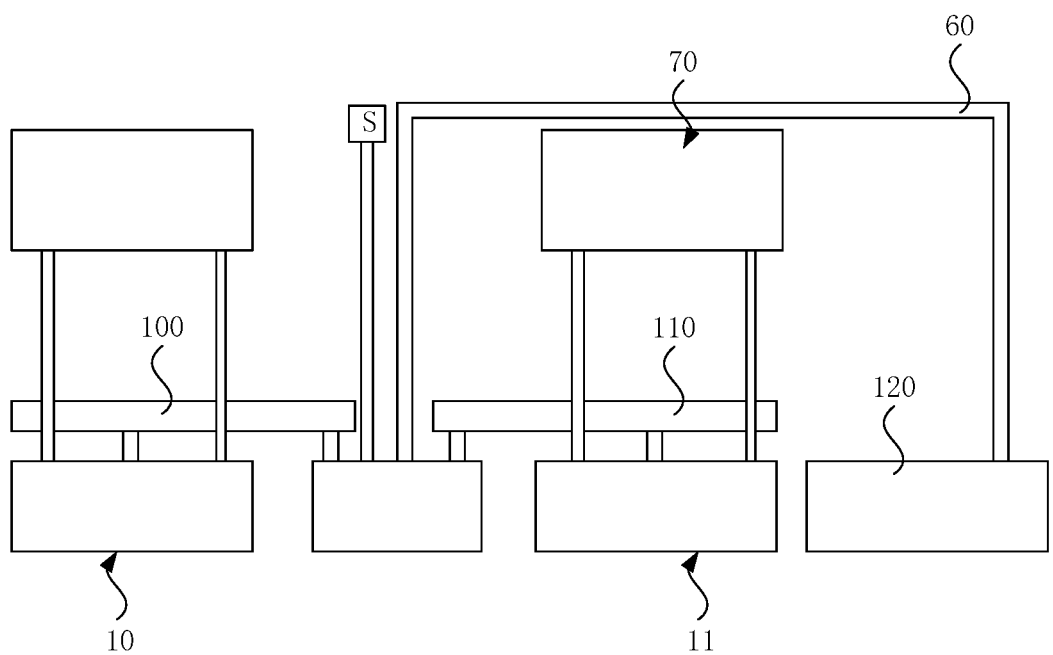
FIG. 6 is a schematic diagram of an embodiment of a semiconductor device.

Further, in an embodiment of the disclosure, the NMOS transistor M1 and the PMOS transistor M2 are electrically connected to the sense amplification unit through a wire. The wire passes through a posterior conductive interconnection layer. Specifically, referring to FIG. 6, which is a schematic diagram of an embodiment of a semiconductor device of the disclosure, the selection switch 130 is arranged between the first memory cell group 10 and the second memory cell group 11. The NMOS transistor M1 and the PMOS transistor M2 of the selection switch 130 are electrically connected to the sense amplification unit 120 through the wire 60. The sense amplification unit 120 is disposed at a side of the first memory cell group 10 or the second memory cell group 11. In this way, the wire 60 passes through the posterior conductive interconnection layer 70 to be electrically connected to the sense amplification unit 120, so as to simplify the layout and placement, and to minimize the signal transmission path.

The foregoing embodiment is merely one embodiment of the selection switch listed in the semiconductor device of the disclosure, and other selection switches, which are known to those skilled in the art and may realize this function, may also be used.

The foregoing descriptions are merely some implementations of the disclosure. It should be pointed out that a person of ordinary skill in the art make several improvements and refinements without departing from the principle of the disclosure, and the improvements and refinements shall fall within the protection scope of the disclosure.

The invention claimed is:

1. A semiconductor device, comprising a plurality of memory cell groups and a plurality of sense amplification circuit groups, at least two memory cell groups sharing a same sense amplification circuit group; and no sense amplification circuit group is arranged between the two memory cell groups;
wherein each memory cell group comprises a plurality of bit lines, each sense amplification circuit group comprises a plurality of sense amplification circuits, and each sense amplification circuit is electrically connected to a respective one of the bit lines;
wherein the plurality of sense amplification circuit groups are respectively located on two sides of the two memory cell groups away from each other; and
wherein the sense amplification circuits are alternately distributed relative to the bit lines.

2. The semiconductor device of claim 1, wherein each sense amplification circuit group acts on at least two memory cell groups.

3. The semiconductor device of claim 1, wherein the semiconductor device further comprises a plurality of selection switch groups, each sense amplification circuit group is electrically connected to the memory cell groups through a respective one of the selection switch groups.

4. The semiconductor device of claim 3, wherein each selection switch group comprises a plurality of selection switches, and each sense amplification circuit is electrically connected to the bit lines through a respective one of the selection switches.

5. The semiconductor device of claim 3, wherein each selection switch group is arranged between two memory cell groups.

6. The semiconductor device of claim 5, wherein the two memory cell groups share a same sense amplification circuit group.

7. The semiconductor device of claim 4, wherein each selection switch comprises an N-channel Metal Oxide Semiconductor (NMOS) transistor and a P-channel Metal Oxide Semiconductor (PMOS) transistor, and each of the NMOS transistor and the PMOS transistor is electrically connected to a respective one of the bit lines in different memory cell groups.

8. The semiconductor device of claim 7, wherein a gate of the NMOS transistor is electrically connected to a gate of the PMOS transistor.

9. The semiconductor device of claim 8, wherein each of the NMOS transistor and the PMOS transistor is electrically connected to a respective one of the sense amplification circuits through a wire, and the wire passes through a posterior conductive interconnection layer.

10. The semiconductor device of claim 6, wherein each sense amplification circuit corresponds to a respective one of the bit lines and a respective one of the selection switches.

* * * * *